(12) United States Patent
Maeda

(10) Patent No.: US 7,449,707 B2
(45) Date of Patent: Nov. 11, 2008

(54) OPTICAL COUPLING DEVICE AND ELECTRONIC APPARATUS USING SAME THAT TRANSMITS A SIGNAL WITH TWO LIGHT EMITTING ELEMENTS AND ONE OR TWO LIGHT RECEIVING ELEMENTS

(75) Inventor: Taiji Maeda, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 99 days.

(21) Appl. No.: 11/514,108

(22) Filed: Sep. 1, 2006

(65) Prior Publication Data
US 2007/0051878 A1    Mar. 8, 2007

(30) Foreign Application Priority Data
Sep. 5, 2005    (JP)    ............................. 2005-256725

(51) Int. Cl.
*G02B 27/00*    (2006.01)
(52) U.S. Cl. .................................. 250/551; 250/214 R
(58) Field of Classification Search ................. 250/551, 250/221, 214 R, 208.1; 385/16, 17, 24, 31
See application file for complete search history.

(56) References Cited

U.S. PATENT DOCUMENTS 4,365,164 A * 12/1982 Sibley ......................... 250/551
5,701,001 A * 12/1997 Sugifune et al. ........ 235/462.42

FOREIGN PATENT DOCUMENTS

| JP | 63-283082 A | 11/1988 |
| JP | 01314991 A | * 12/1989 |
| JP | 11-74567 A | 3/1999 |
| JP | 2004-111413 A | 4/2004 |

* cited by examiner

*Primary Examiner*—Que T Le
(74) *Attorney, Agent, or Firm*—Birch, Stewart, Kolasch & Birch, LLP

(57) ABSTRACT

An input side is configured with a pulse generating circuit, a delay circuit, a driving circuit, and two light emitting elements connected to the driving circuit, and an output side is configured with two light receiving elements, connected to a computation circuit, and the pulse generating circuit, and based on a directly connected input signal, a clock pulse signal that is input from the pulse generating circuit, and a delayed input signal that is input from the delay circuit, the driving circuit causes the two light emitting elements to alternately emit light with offset timing. On the other hand, the computation circuit, while synchronizing with the signals from the two light emitting elements, by alternately receiving signals with the two light receiving elements, transmits a signal by pairing these two light receiving elements.

15 Claims, 6 Drawing Sheets ordinary driving current waveform ordinary light output waveform

OPTICAL COUPLING DEVICE AND ELECTRONIC APPARATUS USING SAME THAT TRANSMITS A SIGNAL WITH TWO LIGHT EMITTING ELEMENTS AND ONE OR TWO LIGHT RECEIVING ELEMENTS

BACKGROUND OF THE INVENTION

This application claims priority under 35 U.S.C. § 119(a) on Japanese Patent Application No. 2005-256725 filed in Japan on Sep. 5, 2005, the entire contents of which are hereby incorporated by reference.

The present invention relates to optical coupling devices that transmit a signal with a light emitting element and a light receiving element, and more specifically, optical coupling devices in which by having a plurality of input-side light emitting elements, high speed operation and a long lifespan are possible, and to electronic apparatuses in which such an optical coupling device is used.

In an optical coupling device, in order to realize high speed response, high speed response of an input-side LED (light emitting diode) is essential. However, because an internal capacity C is present in the LED, high speed response is limited.

FIGS. 5(a) and 5(b) show an ordinary light output waveform (waveform of rising and falling of the LED) when a driving current is applied to the LED. When a high speed pulse driving current as shown in FIG. 5(a) is applied, the actual waveform of the LED is a waveform like that shown in FIG. 5(b). That is, delay times tr and tf respectively occur in the rising and falling of the LED. In this case, for example if an AlGaAs LED, data transfer of 10 MB/s is not a problem. However, when driving at a higher speed than that, it is necessary to control the LED by providing a circuit for controlling the LED on the input side (the sending side).

FIGS. 6(a) to 6(c) show a conventional current application method that drives an LED at high speed (for example, see JP H11-74567A).

In this type of current application method, for an input waveform as shown in FIG. 6(a), with a technique known as peaking, a current $I_3$ that is greater than a driving current that corresponds to a set light output is applied only during the rise. Thus, the rise time tr is made a short time. Also, in this method, with a technique known as a backshoot, the LED is temporarily given a reverse bias during the rise. Thus, the fall time tf is made a short time. Moreover, with this method, in order to make a change in the capacity of the LED as small as possible, a constant current $I_1$ is applied from an LED driving circuit at a level that does not exceed a threshold current of a light receiving element even when the signal is off. Thus, an even faster response is made possible in the optical coupling device. However, by increasing the value of the fixed current $I_1$, the power consumed when the input signal is off increases.

In the technology described in JP H11-74567A, a control method is disclosed for allowing the LED to respond quickly, but in for example an optical coupling device such as a photocoupler, constant driving of the LED results in an increase in power consumption, so this method was not applied in the conventional technology.

That is, in an optical coupling device such as a photocoupler, when, in order to quickly drive on/off, driving current is constantly applied to an LED on the input side (sending side) even when the signal is off, there is the problem that power consumption increases. Also, by constantly driving the LED, deterioration of the LED itself occurs more quickly, and product defects are generated by a decrease in the amount of light, leading to a shorter product lifespan.

SUMMARY OF THE INVENTION

The present invention was made in view of these problems, and it is an object thereof to provide an optical coupling device in which a high speed response is possible while preventing a decrease in the amount of light of the light emitting element due to premature deterioration, and an electronic apparatus in which such an optical coupling device is used.

In order to address the above problems, the optical coupling device of the present invention, which is an optical coupling device that transmits a signal with a light emitting element and a light receiving element, includes two light emitting elements and a light emitting element driving circuit that drives these light emitting elements on an input side, and light emission of these light emitting elements is started and stopped at different times by the light emitting element driving circuit. That is, in the present invention, input signals are alternately applied at different times to two light emitting elements, so it is possible to increase the speed of response.

Also, in the optical coupling device of the present invention, two light receiving elements are provided on an output side, and a signal is forwarded by pairing the two light receiving elements and the two light emitting elements. By creating two pairs in a single package using two light receiving elements in this manner, a driving operation becomes possible. Also, a configuration is adopted in which with a light receiving side computation circuit, signals are received with different timing while being synchronized with the signals from the two light emitting elements. By adopting such a configuration, high speed signal transmission becomes possible.

In this case, the two light emitting elements have different wavelengths, and the two light receiving elements have light receiving sensitivity for the respective wavelengths of the light emitting elements. By, in this manner, adopting a configuration in which the two light emitting elements have different wavelengths, it becomes possible to prevent erroneous operation. Also, by manufacturing two faces of light receiving portions that have light receiving sensitivity for the respective wavelengths of the light emitting elements on the output side (the light receiving side), the output side can have a one chip configuration, and high speed forwarding with this one chip becomes possible.

Also, the light emitting element driving circuit, along with generating a pulse signal, drives one of the light emitting elements with a signal obtained by sampling an input signal at a timing from L to H of this pulse signal, and drives the other light emitting element with a signal obtained by sampling an input signal at a timing from H to L of the pulse signal. By, in this manner, synchronizing an input signal with a fixed pulse signal (a clock pulse signal), and offsetting the drive timing of the two light emitting elements such that the timing is matched to this pulse signal, high speed forwarding becomes possible.

In this case, a configuration is adopted in which the pulse width of the pulse signal is the same as the minimum pulse width of the input signal, and the input signal and the pulse signal are synchronized. By, in this manner, making the pulse width of the pulse signal the same as the minimum pulse width of the input signal, and synchronizing the input signal and the pulse signal, it is possible to sample an input signal at the same timing as a high speed pulse signal, and with this sampled signal, drive the two light emitting elements with offset timing.

Further, the light emitting element driving circuit may be provided with a conventional peaking function and backshoot function. By, in this manner, providing the light emitting element driving circuit with a conventional peaking function and backshoot function, higher speed signal forwarding becomes possible.

By equipping an electronic apparatus with this sort of optical coupling device, it is possible to provide an electronic apparatus in which high speed signal transmission is possible.

BRIEF DESCRIPTION OF THE DRAWINGS

FIG. 6(a) is a waveform diagram of the input signal, FIG. 6(b) is a waveform diagram of the driving current, and FIG. 6(c) is a waveform diagram of light output.

DESCRIPTION OF THE PREFERRED EMBODIMENTS

Hereinafter, embodiments of the present invention will be described with reference to the accompanying drawings.

Embodiment 1

Figure 1:
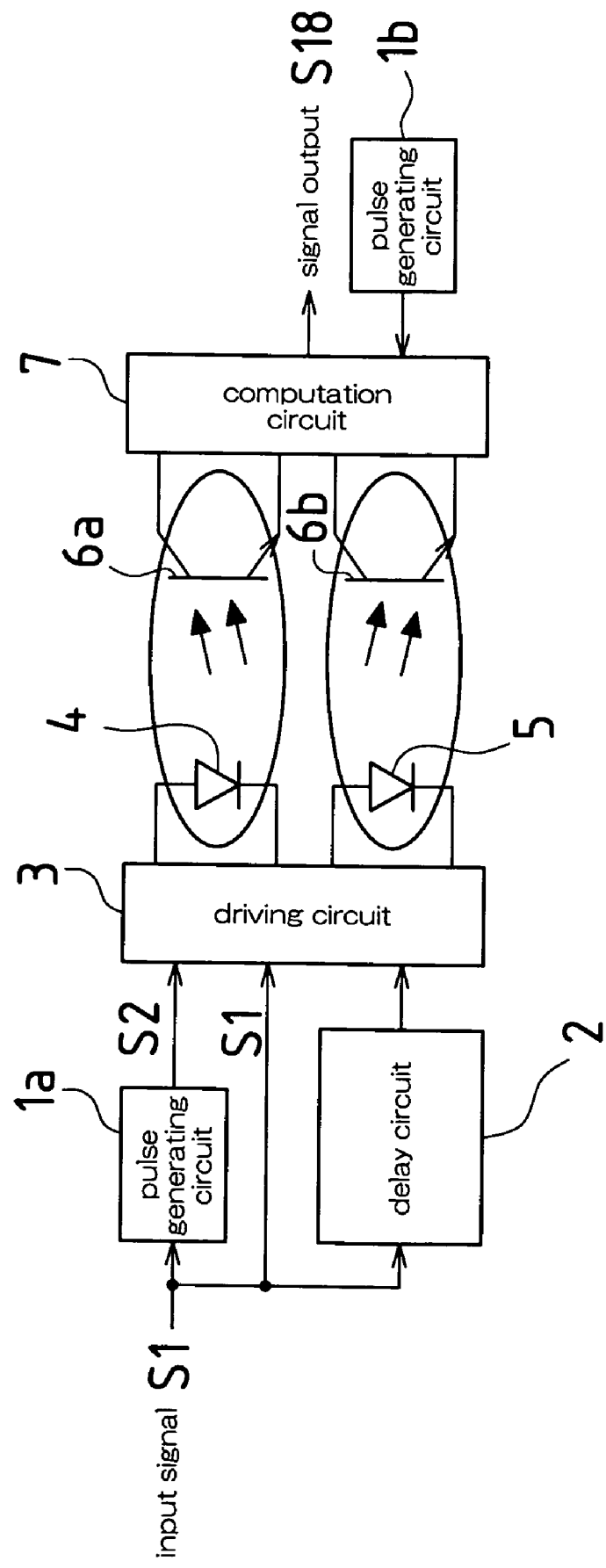
FIG. 1 is a functional block diagram of an optical coupling device according to Embodiment 1 of the present invention.

FIG. 1 is a functional block diagram of an optical coupling device according to Embodiment 1.

In the optical coupling device of Embodiment 1, an input side is configured with a pulse generating circuit 1a, a delay circuit 2, a driving circuit 3, and two light emitting elements 4 and 5 connected to the driving circuit 3, and an output side is configured with two light receiving elements 6a and 6b connected to a computation circuit 7, and a pulse generating circuit 1b.

An input signal S1 is input to the driving circuit 3 and to the delay circuit 2, and is further input to the pulse generating circuit 1a, which generates a clock pulse signal. The pulse generating circuit 1a generates a clock pulse signal S2 with a high speed synchronized with the input signal S1, and this is input to the driving circuit 3. The delay circuit 2, after delaying the input signal S1 for ½ the pulse of the clock pulse signal S2, inputs the input signal S1 to the driving circuit 3. The driving circuit 3, based on these input signals, causes the two light emitting elements 4 and 5 to emit light with different timings.

On the other hand, in the computation circuit 7, while synchronizing with the signals from the two light emitting elements 4 and 5, by alternately receiving signals with the two light receiving elements 6a and 6b, signals are forwarded with these two light receiving elements 6a and 6b used as a pair. That is, in Embodiment 1, two pairs of a light emitting element and a light receiving element are manufactured in a single package. In this case, in the package it is necessary to completely separate the light of the two LEDs 4 and 5. This is in order to prevent erroneous operation due to crosstalk due to interference of the light of the LEDs with each other.

Figure 2A:
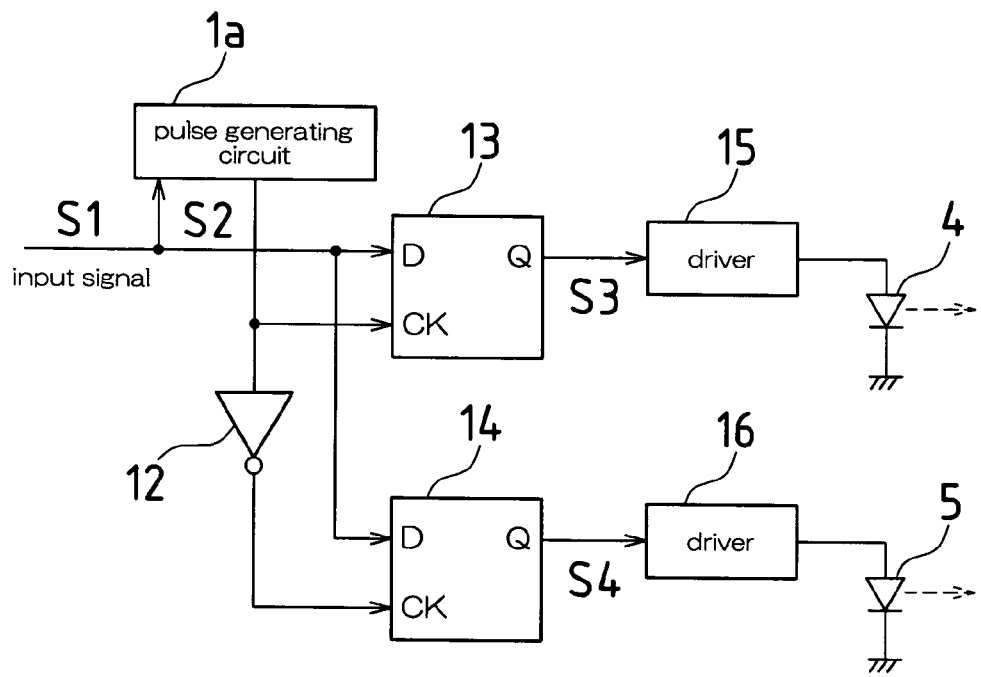
FIGS. 2(a) and 2(b) are block diagrams that show examples of a more specific circuit configuration of the optical coupling device according to Embodiment 1 of the present invention.
Figure 2B:
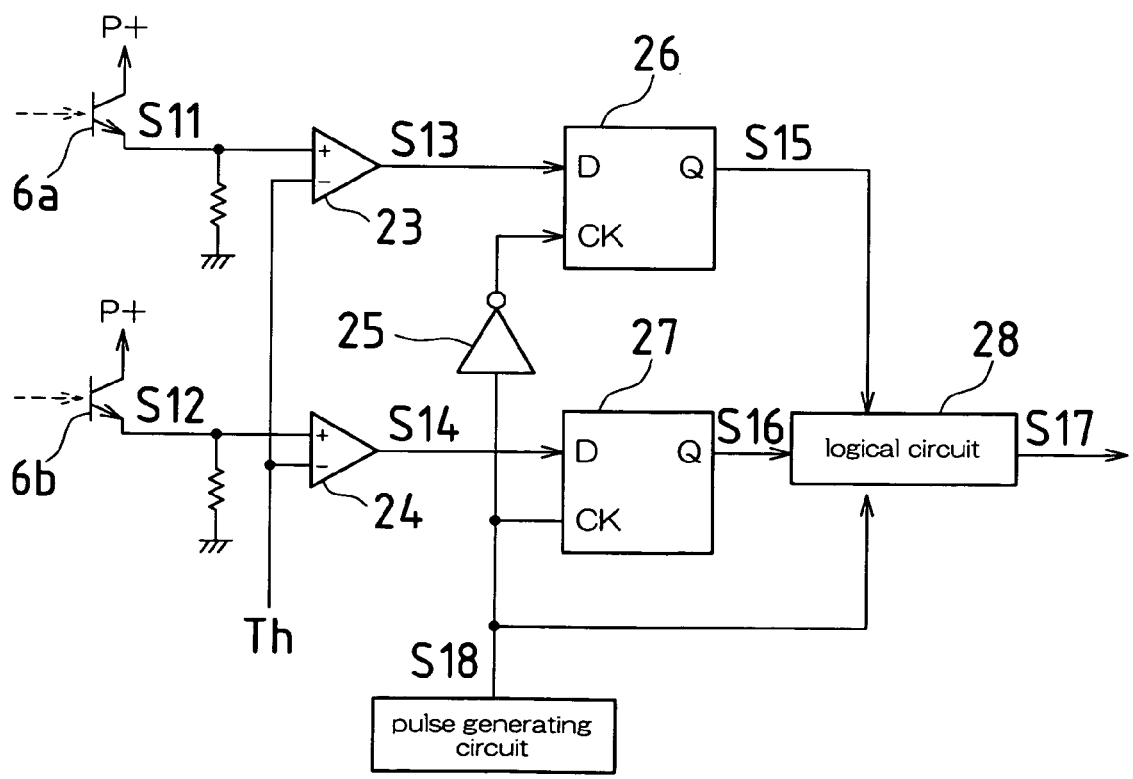

FIGS. 2(a) and 2(b) show examples of a more specific circuit configuration of the optical coupling device with the above configuration.

In this example, the input side shown in FIG. 2(a) is configured from the pulse generating circuit 1a, an inverter 12, two D flip-flop circuits 13 and 14, two drivers 15 and 16, and the two light emitting elements (LEDs) 4 and 5. The output side shown in FIG. 2(b) is configured from the two light receiving elements 6a and 6b, two comparison circuits 23 and 24, an inverter 25, two D flip-flop circuits 26 and 27, a logical circuit 28, and the pulse generating circuit 1b.

That is, the input signal S1 is input to the pulse generating circuit 1a, and to a data terminal D of each D flip-flop circuit 26 and 27. Also, the clock pulse signal S2 of the pulse generating circuit 1a is input to a clock terminal CK of the D flip-flop circuit 13, and is input to the clock terminal CK of the D flip-flop circuit 14 via the inverter 12. Then, a Q output (a signal S3) of the D flip-flop circuit 13 is applied to the LED 4 via a driver 15, and the Q output (a signal S4) of the D flip-flop circuit 14 is applied to the LED 5 via a driver 16.

On the other hand, an output signal S11 of the light receiving element 6a is input to the positive terminal of a comparison circuit 23, in which a reference signal Th has been input to its negative terminal, and an output signal S13 of the comparison circuit 23 is input to the data terminal D of the D flip-flop circuit 26. Also, an output signal S12 of the light receiving element 6b is input to the positive terminal of a comparison circuit 24, in which the reference signal Th has been input to its negative terminal, and an output signal S14 of the comparison circuit 24 is input to a data terminal D of the D flip-flop circuit 27.

A clock pulse signal S18 of the pulse generating circuit 1b is input to the clock terminal CK of the D flip-flop circuit 27, and is input to the clock terminal CK of the D flip-flop circuit 26 via an inverter 25. Then, a Q output (a signal S15) of the D flip-flop circuit 26 and a Q output (a signal S16) of the D flip-flop circuit 27 are input to the logical circuit 28, and a signal S17 that has been logically computed in the logical circuit 28 is output as an output signal to a next stage circuit.

Figure 3:
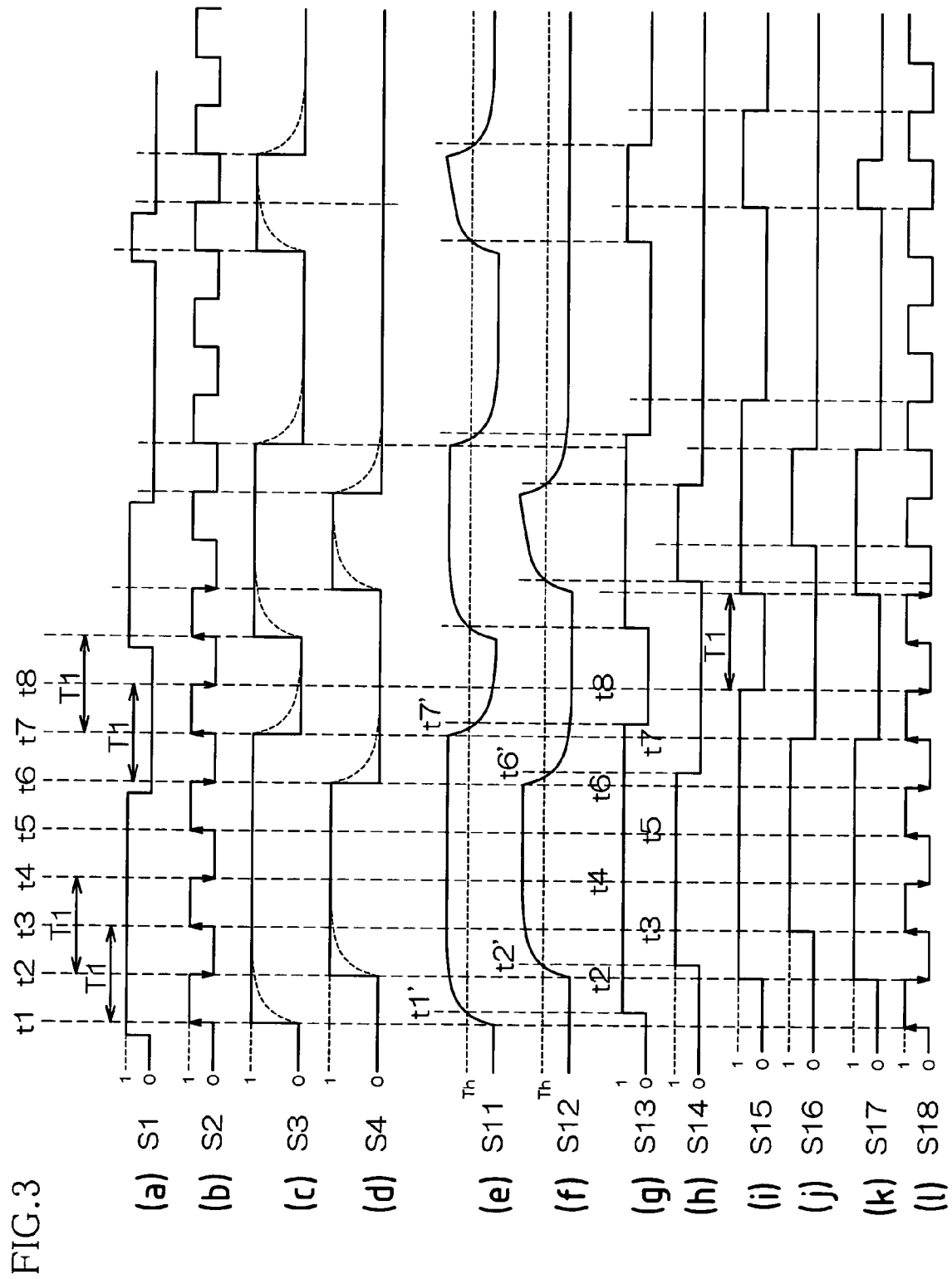
FIG. 3 is a timing chart that shows input signal waveforms and output signal waveforms of the optical coupling device.

FIG. 3 is a timing chart that shows input signal waveforms and output signal waveforms of an optical coupling device with the circuit configuration shown in FIG. 2. Below, operation of the optical coupling device of Embodiment 1 will be described with reference to the timing chart shown in FIG. 3. Signals S1 to S18 in FIG. 3 correspond to the signals S1 to S18 shown in FIG. 2. That is, in FIG. 3, (A) indicates the waveform of input signal S1, and (B) indicates the clock pulse signal S2 synchronized with the input signal S1 output from the pulse generating circuit 1a.

The D flip-flop circuit 13, at the timing that the clock pulse signal S2 synchronized with the input signal S1 rises from L to H (time t1, t3, t5, t7, . . . ), samples the input signal S1, and drives the LED 4 with that sampling signal S3. That is, the D-flip-flop circuit 13 holds the application state of the signal S3 to the LED 4 for a time period (T1) that the next pulse wave of the clock pulse signal S2 rises from L to H. That is, when the pulse wave has risen from L to H, when the input signal S1 is "1" (at times t1, t3, and t5), a bias voltage is applied to the LED 4 for the time period (T1) that the next pulse wave rises from L to H, regardless of the input signal S1. Also, when the pulse wave has risen from L to H, when the input signal S1 is "0" (at time t7), a bias voltage is not applied to the LED 4 for the time period (T1) that the next pulse wave of the clock pulse signal S2 rises from L to H, regardless of the input signal S1. Accordingly, the waveform of the signal S3 of the Q output of the D flip-flop circuit 13 becomes the waveform shown in (C) in FIG. 3.

Likewise, the D flip-flop circuit 14, at the timing that the clock pulse signal S2 synchronized with the input signal S1 falls from H to L (time t2, t4, t6, . . . ), samples the input signal S1, and drives the LED 5 with that sampling signal S4. That is, the D-flip-flop circuit 14 holds the application state of the signal S4 to the LED 5 for a time period (T1) that the next pulse wave of the clock pulse signal S2 falls from H to L. That is, when the pulse wave has fallen from H to L, when the input signal S1 is "1" (at times t2 and t4), a bias voltage is applied to the LED 5 for the time period T1 that the next pulse falls from H to L, regardless of the input signal S1. Also, when the pulse wave has fallen from H to L, when the input signal S1 is "0" (at time t6), a bias voltage is not applied to the LED 5 for the time period T1 that the next pulse wave falls from H to L, regardless of the input signal S1. Accordingly, the waveform of the signal S4 of the Q output of the D flip-flop circuit 14 becomes the waveform shown in (D) in FIG. 3.

In this manner, in the present invention, on the input side, the input signal S1 is synchronized with the pulse wave of the clock pulse signal S2, and the input signal S1 is divided in two so as to match the timing at which the pulse wave rises and the timing at which the pulse wave falls.

On the other hand, on the output side (the light receiving side), the comparison circuit 23 compares the output signal S11 of the light receiving element 6a that receives the signal S3 shown in (C) in FIG. 3 to the reference signal Th (see (E) in FIG. 3). As a result, the output signal S13 of the comparison circuit 23, as shown in (G) in FIG. 3, has a signal waveform that becomes H at the timing of time t1', and becomes L at the timing of time t7', and the output signal S13 is input to the data terminal D of the D flip-flop circuit 26.

Likewise, the comparison circuit 24 compares the output signal S12 of the light receiving element 6b that receives the signal S4 shown in (D) in FIG. 3 to the reference signal Th (see (F) in FIG. 3). As a result, the output signal S14 of the comparison circuit 24, as shown in (H) in FIG. 3, has a signal waveform that becomes H at the timing of time t2', and becomes L at the timing of time t6', and the output signal S14 is input to the data terminal D of the D flip-flop circuit 27.

The D flip-flop circuit 26, at the timing that the clock pulse signal S18 (see (L) in FIG. 3) falls from H to L (time t2, t4, t6, t8, . . . ), samples the output signal S13, and outputs that sampling signal S15 to the logical circuit S28. That is, the D-flip-flop circuit 26 holds that sampling signal for a time period (T1) that the next pulse wave of the clock pulse signal S18 falls from H to L. Described more specifically, when the pulse wave has fallen from H to L, when the output signal S13 is "1" (at times t2, t4, t6), that state is held for the time period T1 that the next pulse wave falls from H to L, regardless of the output signal S13. Also, when the pulse wave has fallen from H to L, when the output signal S13 is "0" (at time t8), that state is held for the time period T1 that the next pulse wave falls from H to L, regardless of the output signal S13. Accordingly, the waveform of the signal S15 of the Q output of the D flip-flop circuit 26 becomes the waveform shown in (I) in FIG. 3.

Likewise, the D flip-flop circuit 27, at the timing that the clock pulse signal S18 rises from L to H (time t3, t5, t7, . . . ), samples the output signal S14, and outputs that sampling signal S16 to the logical circuit 28. That is, that sampling signal is held for a time period (T1) that the next pulse wave of the clock pulse signal S18 rises from L to H. Described more specifically, when the pulse wave has risen from L to H, when the output signal S14 is "1" (at times t3 and t5), that state is held for the time period T1 that the next pulse wave rises from L to H, regardless of the output signal S14. Also, when the pulse wave has risen from L to H, when the output signal S14 is "0" (at time t7), in the time period T1 that the next pulse wave rises from L to H, that state is held regardless of the output signal S14. Accordingly, the waveform of the signal S16 of the Q output of the D flip-flop circuit 27 becomes the waveform shown in (J) in FIG. 3.

The logical circuit 28 combines these two output signals S15 and S16, acquiring an output signal S17 with a waveform such as that shown in (K) in FIG. 3. In this case, on the output side (the light receiving side), same as on the input side (the signal sending side), by synchronizing to the same frequency as the pulse wave on the input side (the signal sending side) using the pulse generating circuit 1b, it is possible to receive the signals of the LEDs 4 and 5 with the same timing as H/L of the pulse waves.

Embodiment 2

Next is a description of an optical coupling device according to Embodiment 2 of the present invention.

Figure 4:
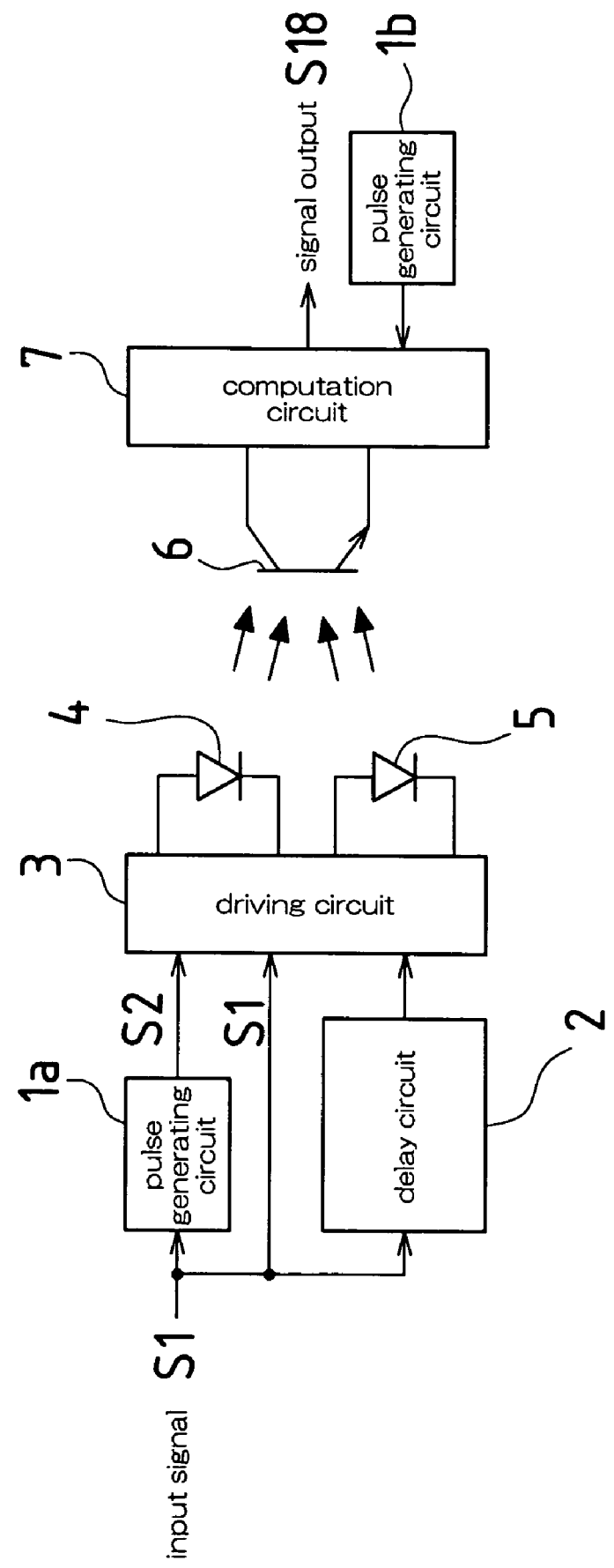
FIG. 4 is a functional block diagram of an optical coupling device according to Embodiment 2 of the present invention.
Figure 5A:
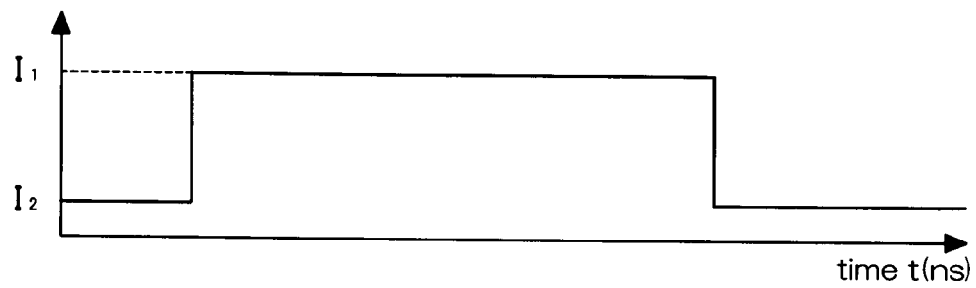
FIGS. 5(a) and 5(b) are timing charts that show an ordinary light output waveform when a driving current has been applied to an LED.
Figure 5B:
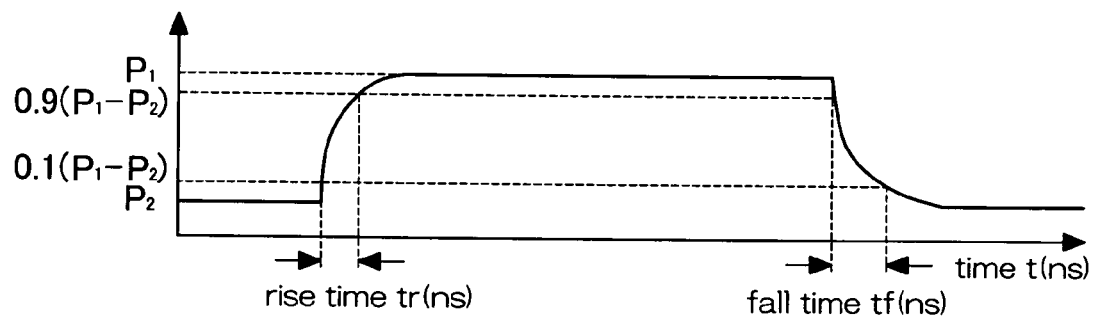
Figure 6A:
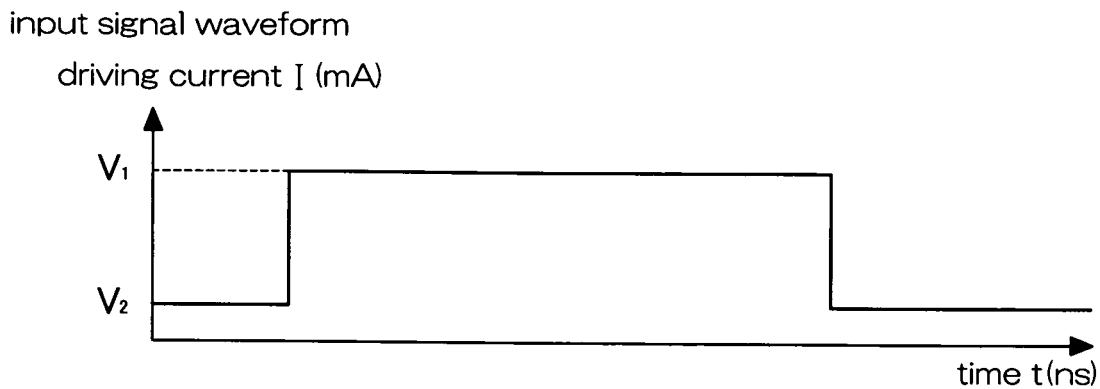
FIGS. 6(a) to 6(c) show a conventional current application method that drives an LED at high speed.
Figure 6B:
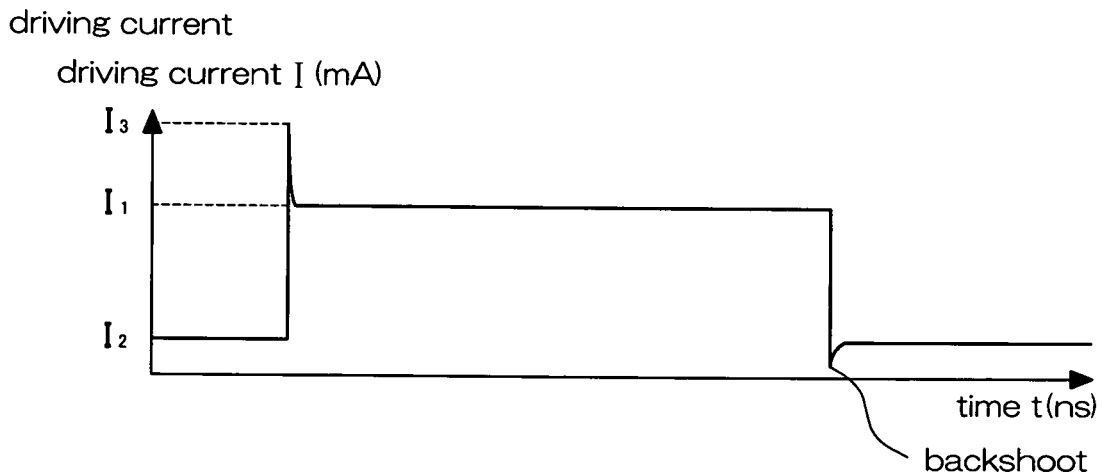
Figure 6C:
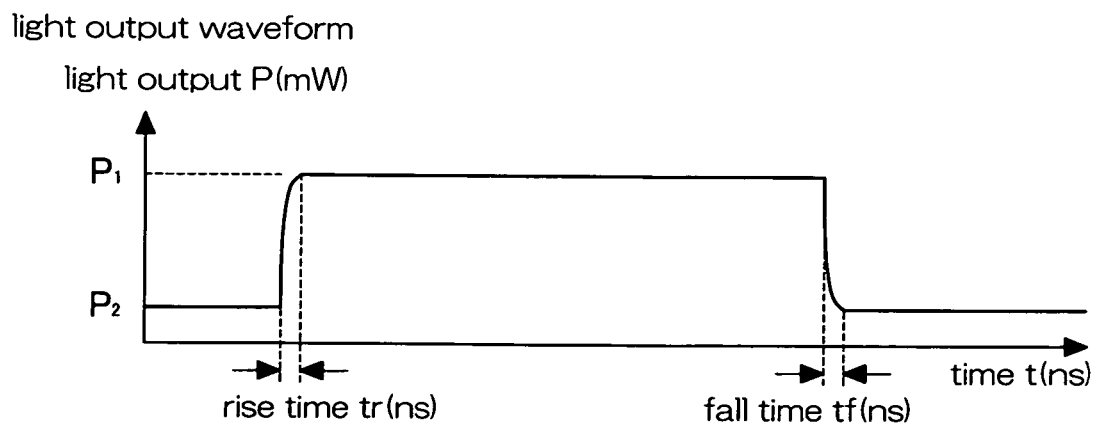

FIG. 4 is a functional block diagram of the optical coupling device according to Embodiment 2 of the present invention.

In Embodiment 2, the two LEDs 4 and 5 have different wavelengths, and with respect to the output side (the light receiving side), light receiving faces are manufactured at two locations on a single chip, and by providing sensitivity to the wavelengths of LEDs 4 and 5 in the each respective light receiving face, the light receiving element 6 can be formed with a single chip. The driving method in Embodiment 2 is the driving method according to the timing chart shown in FIG. 3, and so a description thereof is omitted here.

In above Embodiment 1, because two pairs of a light emitting element and a light receiving element need to be manufactured in a single package, and in order to prevent erroneous operation it is necessary to design such that the lights of the two LEDs 4 and 5 do not interfere with each other, it is difficult to adopt a small size for the package. In Embodiment 2, however, because the wavelengths differ, it is not necessary to consider interference of the lights of the LEDs with each other, and because the output side (the light receiving side) can be completed in a single chip, a small package size is possible.

Further, in the present invention, by further adding to the processing in the driving circuit 3 a peaking function and backshoot function ordinarily used in the conventional technology, higher speed driving and signal forwarding becomes possible.

The present invention may be embodied in various other forms without departing from the gist or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. An optical coupling device comprising:
   two light emitting elements and a light emitting element driving circuit provided on an input side, wherein the light emitting elements emit light; and one or two light receiving elements, provided on an output side, for directly receiving the light emitted from the light emitting elements,
   wherein the optical coupling device transmits a signal by allowing starting and stopping of these light emitting elements to be performed by the light emitting element driving circuit with different timings.

2. The optical coupling device according to claim 1, comprising two light receiving elements and a light receiving side computation circuit provided on the output side, wherein a signal is forwarded by pairing the two light receiving elements and the two light emitting elements.

3. The optical coupling device according to claim 2, wherein with the light receiving side computation circuit, signals are received with a different timing while being synchronized with signals from the two light emitting elements.

4. The optical coupling device according to claim 3, wherein the two light emitting elements have different wavelengths, and the two light receiving elements have light receiving sensitivity for the respective wavelengths of the light emitting elements.

5. The optical coupling device according to claim 1, wherein the light emitting element driving circuit, along with generating a pulse signal, drives one of the light emitting elements with a signal obtained by sampling an input signal at a timing from L to H of this pulse signal, and drives the other light emitting element with a signal obtained by sampling an input signal at a timing from H to L of the pulse signal.

6. The optical coupling device according to claim 5, wherein the pulse width of the pulse signal is the same as the minimum pulse width of the input signal, and the input signal and the pulse signal are synchronized.

7. The optical coupling device according to claim 1, wherein the light emitting element driving circuit is provided with a peaking function and a backshoot function.

8. An electronic apparatus in which signal transmission is performed using the optical coupling device according to claim 1.

9. An electronic apparatus in which signal transmission is performed using the optical coupling device according to claim 2.

10. An electronic apparatus in which signal transmission is performed using the optical coupling device according to claim 3.

11. An electronic apparatus in which signal transmission is performed using the optical coupling device according to claim 4.

12. An electronic apparatus in which signal transmission is performed using the optical coupling device according to claim 5.

13. An electronic apparatus in which signal transmission is performed using the optical coupling device according to claim 6.

14. An electronic apparatus in which signal transmission is performed using the optical coupling device according to claim 7.

15. The optical coupling device according to claim 1, wherein the light emitting elements include a first light emitting element and a second light emitting element and light emitted from the first light emitting element is separate from light emitted from the second light emitting element.

* * * * *